United States Patent [19]

Chang et al.

[11] Patent Number: 5,912,106
[45] Date of Patent: Jun. 15, 1999

[54] METHOD FOR IMPROVING PHOTOIMAGE QUALITY

[75] Inventors: Chia-Hu Chang, New City, N.Y.; Andrew Mar, Norwalk, Conn.; Thai Hong Nguyen, Airmont; Harry Joseph Evers, Clinton Corners, both of N.Y.; Hugh Stephen Laver, Reinach, Switzerland

[73] Assignee: Ciba Specialty Chemicals Corporation, Tarrytown, N.Y.

[21] Appl. No.: 08/820,322

[22] Filed: Mar. 12, 1997

Related U.S. Application Data

[63] Continuation-in-part of application No. 08/707,020, Sep. 10, 1996, abandoned.

[51] Int. Cl.⁶ ..................................................... G03F 7/028
[52] U.S. Cl. ........................................ 430/281.1; 430/917
[58] Field of Search ........................................... 430/281.1

[56] References Cited

U.S. PATENT DOCUMENTS

| | | | |
|---|---|---|---|
| 4,137,081 | 1/1979 | Pohl | 96/36.3 X |
| 4,180,403 | 12/1979 | Nacci et al. | 430/281.1 |
| 4,216,019 | 8/1980 | Reed et al. | 430/308 |
| 4,264,705 | 4/1981 | Allen | 430/271.1 |
| 4,427,759 | 1/1984 | Gruetzmacher et al. | 430/273.1 |
| 4,431,723 | 2/1984 | Proskow | 430/286.1 |
| 4,442,302 | 4/1984 | Pohl | 430/159.23 |
| 4,517,279 | 5/1985 | Worms | 430/286.1 |
| 4,540,649 | 9/1985 | Sakurai | 430/270.1 |
| 4,666,821 | 5/1987 | Hein et al. | 430/311 |
| 4,716,094 | 12/1987 | Minonishi et al. | 430/284.1 |
| 4,824,765 | 4/1989 | Sperry et al. | 430/281.1 |
| 5,501,942 | 3/1996 | Solmin et al. | 430/280.1 |

FOREIGN PATENT DOCUMENTS

| | | |
|---|---|---|
| 1267475 | 4/1990 | Canada . |
| 0252150 | 1/1988 | European Pat. Off. . |
| 0261910 | 3/1988 | European Pat. Off. . |
| 0295944 | 12/1988 | European Pat. Off. . |
| 0335247 | 10/1989 | European Pat. Off. . |
| 2198736 | 6/1988 | United Kingdom . |
| 9512148 | 5/1995 | WIPO . |

OTHER PUBLICATIONS

RN 2516–92–9, Registry, Copyright 1997 ACS, Registration numberofbis(2,2,6,6–tetramethylpiperidine–1oxyl)sebacate.
122:265260, Chemical Abstracts, Abstract of JP06247932 A2, published Feb. 25, 1993.
103:71819, Chemical Abstracts, ACS, Abstract of JP 60036501, published Aug. 10, 1983.

*Primary Examiner*—Cynthia Hamilton
*Attorney, Agent, or Firm*—Luther A. R. Hall

[57] ABSTRACT

The instant invention pertains to a method of improving the quality and resolution of photoimages by incorporating into the photocurable resin composition to be used a selected amount of a polymerization inhibitor so that photopolymerization of the photocurable resin is inhibited in those areas not directly impinged by light.

6 Claims, No Drawings

METHOD FOR IMPROVING PHOTOIMAGE QUALITY

This is a continuation-in-part of application Ser. No. 08/707,020, filed on Sep. 10, 1996 now abandoned.

The instant invention pertains to a method of improving the quality and resolution of photoimages by incorporating into the photocurable resin composition to be used a selected amount of a polymerization inhibitor so that photopolymerization of the photocurable resin is inhibited in those areas not directly impinged by light. The light may be visible, infrared, actinic or laser light.

BACKGROUND OF THE INVENTION

U.S. Pat. Nos. 4,264,705; 4,427,759; 4,431,723; 4,442,302; 4,517,279; 4,540,649 and 4,716,094; Canadian Patent No. 1,267,475 and EP 335,247 describe multilayered elastomeric printing plates, flexographic printing plates and related photopolymerizable compositions used to prepare such plates. It is clear from these representative patents that there are many requirements for the preparation of acceptable printing plates, but chief among such requirements is that the quality of the photoimage be of the highest quality. That is, good resolution or a sharply defined image is essential along with durability and resistance to degradation or erosion by water or solvent based inks. EP 335m247 discloses that a hindered amine should also be present to provide stability to the cured product.

U.S. Pat. No. 4,216,019; EP 252,150 and WO 95/12148 describe the preparation of screen printing stencil compositions giving stencils with solvent/water resistance. These stencils are intended for use to give screen printing images of good resolution and quality.

The general method of using a stencil composition includes applying or coating a photosensitive stencil composition on a screen, drying the composition, exposing the stencil appropriately through a photomask to actinic radiation to form an image, optionally drying the image, treating the stencil with an alkaline developing solution or treating the dried stencil with an aqueous, alkaline ink and printing a substrate.

U.S. Pat. No. 4,517,279 teaches the use of high molecular weight butadiene/acrylonitrile copolymers with a selected carboxyl and acrylonitile content, an photopolymerizable ethylenically unsaturated monomer and photoinitiator as the photopolymerizable resin composition. U.S. Pat. No. 4,716,094 teaches the use of ethylenically unsaturated prepolymers, ethylenically unsaturated monomers, a photoinitiator and a surface tack modifier (to give a tack-free surface) as the photopolymerizable composition.

U.S. Pat. No. 4,666,821 discloses the preparation of hot melt solder masks using photopolymerizable compositions.

U.S. Pat. No. 4,824,765 describes the use of water-soluble photoinitiators in general photoimaging processes useful to prepare printing plates, screen printing stencils, solder masks, litho and letterpress printing plates, etch resists, UV cured inks, overcaoting lacquers and abrasion or mar resistant coatings.

U.S. Pat. No. 5,501,942 give a typical procedure for the preparation of solder masks or resists which include applying a photosensitive composition to a substrate, removing water from the composition to form a photosensitive film on the substrate, exposing the coated substrate with actinic light in a desired pattern, removing the unexposed areas of said coating with an aqueous or aqueous-alkaline solution to uncover the substrate in the non-exposed areas, and subjecting the coating, on the substrate to a thermal or option UV cure.

EP 261,910 and EP 295,944 both describe the water developable photosensitive resin plate suitable for making relief printing plates with high resistance to water-based inks.

From each of these references and the art generally, it is clear that steps for producing printing plates, solder masks or any other of the end-use application mentioned above involve a photopolymerizable composition having the following components:

(a) a polymer or prepolymer containing, some polymerizable or crosslinkable groups;

(b) an ethylenically unsaturated monomer;

(c) a photoinitiator or light activated cationic catalyst; and optionally (d) other compounds aimed at modifying some aspect of the ultimate polymerized or cured final product.

These references note that actinic radiation is used to polymerize the liquid photopolymerizable resin composition for making the stencil, printing plate, etch resist or solder mask, but none of the references teaches or suggests that the quality or the stability of the photoimage can be greatly enhanced by inclusion ol a polymerization inhibitor in the photopolymerizable resin composition The photoimaging technique is used in many fields such as printing plates, etch resists and solder mask applications. Photomasks have always been used in such applications to transfer an image onto a light sensitive or photopolymerizable material. The process begins with the irradiation of actinic light onto the light sensitive material placed under a photomask. Where the incident light passes through the transparent or open part of the photomask onto the light sensitive material, said material hardens via polymerization or crosslinking steps. Where the irradiated light is blocked by the photomask, the light sensitive material beneath the photomask should receive no incident actinic light and should remain in an unpolymerized state. During development of said photoimage, the unpolymerized material is then removed from the polymerized material which latter material becomes the photoimage.

Theoretically, such an image should be clear, sharp and of the highest quality. However, in practice there is a problem caused by scattering of the light while it passes through the photomask or where the laser beam impinges causing said light to diffuse out when it exits the photomask. This result is caused by the fact that any photomask has a finite thickness leading to some diffusion of incident light. Also, impurities or fillers in the formulation itself may cause some scattering of the incident light. The diffused incident light causes some polymerization to occur outside of the discrete dimensions of the open portions of the photomask where no polymerization is desired. In the case of printing plates, the unwanted polymerization will cause the reverse image to fill in with excessive polymer so that the printed image will lose its definition and clarity. In the case of electron applications, the unwanted polymerization will fill the space between two lines also reducing the resolution of the desired image.

It is noted that the instant process pertains to both positive and negative resists since each type of resists requires high resolution images.

DETAILED DISCLOSURE

The instant invention pertains to a method to prevent or at least mitigate the unwanted polymerization of photopolymerizable material caused by diffused incident light. Said method involves the addition of an effective inhibiting amount of a monomer polymerization inhibitor into the photopolymerizable material. This inhibitor is sufficient to prevent polymerization when the incident light is diffuse and not directly incident on the material, but is not enough to prevent polymerization when the incident light impinges the material directly. The effective inhibiting amount is from 0.1 to 20% by weight of the photoinitiator concentration or between 0.0001 and 0.2% by weight of the resin composition.

More specifically, the instant invention is to a process to reduce the undesired polymerization caused by scattered and diffused light in a photopolymerizable material and to improve the quality and resolution of the final developed image formed by the irradiation of said photopolymerizable material by light, wherein the process comprises adding to the photopolymerizable material an effective inhibiting amount of an inhibitor selected from the group consisting of N-oxyl or nitroxide compounds, quinone methides, nitroso compounds. phenothiazine and selected phenols, wherein the amount of said inhibitor is sufficient to prevent or mitigate polymerization by diffused or scattered light, but is insufficient to prevent polymerization of the photopolymerizable material irradiated directly by light.

It is noted that the instant invention is not in the exact definition of the photopolymerizable composition, or in the identity of the actinic radiation equipment used, or in the nature of the photoinitiator or other component of the photopolymerizable solution which are all conventional, but rather in the fact that a polymerization inhibitor is added to improve the quality of the photoimage obtained.

The composition useful in the instant process may also contain an effective stabilizing amount of a hindered amine which is different from the N-oxyl inhibitor described above. This hindered amine and any residue from the N-oxyl inhibitor can also improve the storage stability of the printing plate made by the instant process. The residual radical inhibitor in the plate can act as a radical scavenger to prevent the plate from undergoing deterioration by oxidation and/or photodegradation. It is noted that the instant N-oxyl inhibitor may scavenge a radical to form a NOR-hindered amine. The NOR-hindered amines are known to be effective stabilizers in their own right for organic substrates. Thus, there is an added bonus with the use of the instant N-oxyl polymerization inhibitors since they may impair some additional stabilization efficacy to the instant products.

It is noted that most printing presses are run at high speed which generates heat from friction between the printing plate and the printing substrate. Thus, oxidation can readily occur. Any residual radical inhibitor or added hindered ,amine stabilizer will be advantageous for providing protection against plate degradation.

The addition of the radical inhibitor also increases the water resistance of the printing plate. Thus, it is possible to maintain its image resolution when a water-based ink is used since the image swells less. In like manner, the addition of the radical inhibitor also increases the chemical resistance of the printing plate. The presence of an additional hindered amine allows the printing plate improved resistance against both thermal and actinic induced degradation.

A particularly preferred embodiment of the instant invention involves a photosensitive resin composition for preparing a relief printing, plate which comprises (A) from 5 to 98% by weight, based on the total weight of the components (A), (B), (C) and (D), of a polymer selected from the group consisting of a prepolymer, a binder polymer and a mixture thereof, (B) from 1.0 to 94% by weight, based on the total weight of components (A), (B), (C) and (D), of an ethylenically unsaturated monomer or mixture thereof, (C) from 0.001 to 10% by weight, based on the total weight of components (A), (B), (C) and (D), of a photopolymerization initiator selected from the group consisting of acetophenone and a derivative thereof, benzoin and a derivative thereof, benzophenone and a derivative thereof, anthraquinone and a derivative thereof, xanthone and a derivative thereof, thioxanthrone and a mixture thereof, and a mixture of one or more of these initiators, and (D) from 0.0001 to 0.2% by weight, based on the total weight of components (A), (B), (C) and (D), of a polymerization inhibitor selected from the group consisting of nitroxyl radicals, the quinone methides, phenothiazine, hydroquilnones, selected phenols, galvinoxyl and nitroso compounds.

An especially preferred embodiment is when the composition described above additional contains component (E) which is from 0.05 to 10% by weight, based on the total weight of the composition, of a hindered amine containing a 2,2,6,6-tetramethyl-piperidine moiety.

The inhibitors useful in the instant invention are the nitroxyl radicals, the quinone methides, phenothiazine, hydroquinones, selected phenols, nitroso compounds, galvinoxyl [2,6-di-tert-butyl-α-(3,5-di-tert-butyl-4-oxo-2,5-cyclopentadien-1-ylidene-p-tolyloxy, free radical] and the like.

Some specific nitroxyl compounds of special interest are listed below as follow:

di-tert-butyl nitroxyl,
1-oxyl-2,2,6,6-tetramethylpiperidine,
1-oxyl-2,2,6,6-tetramethylpiperidin-4-ol,
1-oxyl-2,2,6,6-tetramethylpiperidin-4-one,
1-oxyl-2,2,6,6-tetramethylpiperidin-4-yl acetate,
1-oxyl-2,2,6,6-tetramethylpiperidin-4-yl 2-ethylhexanoate,
1-oxyl-2,2,6,6-tetramethylpiperidin-4-yl stearate,
1-oxyl-2,2,6,6-tetramethylpiperidin-4-yl benzoate,
1-oxyl-2,2,6,6-tetramethylpiperidin-4-yl 4-tert-butylbenzoate,
bis(1-oxyl-2,2,6,6-tetramethylpiperidin-4-yl) succinate,
bis(1-oxyl-2,2,6,6-tetramethylpiperidin-4-yl) adipate,
bis(1-oxyl-2,2,6,6-tetramethylpiperidin-4-yl) sebacate,
bis(1-oxyl-2,2,6,6-tetramethylpiperidin-4-yl) n-butylmalonate,
bis(1-oxyl-2,2,6,6-tetramethylpiperidin-4-yl) phthalate,
bis(1-oxyl-2,2,6,6-tetramethylpiperidin-4-yl) isophthalate,
bis(1-oxyl-2,2,6,6-tetramethylpiperidin-4-yl) terephthalate,
bis(1-oxyl-2,2,6,6-tetramethylpiperidin-4-yl) hexahydroterephthalate,
N,N'-bis(1-oxyl-2,2,6,6-tetramethylpiperidin-4-yl) adipamide,
N-(1-oxyl-2,2,6,6-tetramethylpiperidin-4-yl)-caprolactam,
N-(1-oxyl-2,2,6,6-tetramethylpiperidin-4-yl)-dodecylsuccinimide,
2,4,6-tris(1-oxyl-2,2,6,6-tetramethylpiperldin-4-yl isocyaniurate,
2,4,6-tris-[N-butyl-N-(1-oxyl-2,2,6,6-tetramethylpiperidin-4-yl]-s-triazine, and
4,4'-ethylenebis(1-oxyl-2,2,6,6-tetramethylpiperazin-3-one).

Especially preferred as the polymerization inhibitor is bis(1-oxyl-2,2,6,6-tetra-methylpiperidin-4-yl) sebacate;
4-benzylidene-2,6-di-tert-butyl-cyclohexa-2,5-dienone; or
1-oxyl-2,2,6,6-tetramethyl-4-hydroxypiperidine.

The ethylenically unsaturated monomers or oligomers which can be used in the instant process include natural rubber, synthetic rubber, epoxy (meth)acrylate, urethane (meth)acrylate, polyester (meth)acrylate, unsaturated polyester styrene, vinyl ethers and vinyl functional resins and derivatives of the above named classes of monomers or oligomers or copolymers thereof The different classes of photoinitiators which can be used in the instant process include benzoin and benzoin ether derivatives, benzil ketal derivatives, α,α-dialkoxyacetophenone derivatives, α-hydroxyalkylphenotie derivatives, α-aminoalkylphenone derivatives, acylphosphine oxides, acyl phosphine sulfides, phenylglyoxylate derivatives, O-acyl-α-oximino ketone derivatives, benzophenione and its derivatives, Michler's ketone, thioxanthone and derivatives, metallocene compounds, bisimidazaole and derivatives and all the polymer-bound compounds of the type mentioned above.

More specifically, suitable examples of photoinitiator systems are aromatic carbonyl compounds such as benzoin, benzoini alkyl ethers, such as the isopropyl or n-butyl ether, α-substituted acetophenones, preferably benzil ketals, such as benzil dimethyl ketal, or α-halogen-substituted icetophenonies, such as trichloroniethyl-p-tert-butyl phenyl ketone or miorpholinomethyl phenyl ketone, or dialkoxyacetophenones, such as diethoxyacetophenone, or α-hydroxyacetophenones, such as 1-hydroxycyclohexyl phenyl ketone, or benzophenones, such as benzophenone or bis(4-dimethylamnino)benzophenone; or metallocene initiators, such as titanocene initiators, for example bis(π-methyl-cyclopentadienyl)bis(σ-pentafluorophenyl)titanium (IV); or a stannan in conjunction with a photoreducible dye, for example dimethylbenzylstannan in conjunction with methlene blue or Bengal pink; or a quinone or a thioxanthone in conjunction with an amine which carries at least one hydrogen atom at an α-carbon atoms, such as antraquinone, benzoquinone or thioxanthone in conjunction with bis(4-dimethylamino)benzophenone or triethanolamine; or a thioxanthone, for example an alkyl- or halogen-substituted thioxanthone, such as 2-isopropylthioxanthone or 2-chlorothioxanthone; or acyl phosphides; or electron transfer systems such as borates in combination with electron acceptors that absorb light; or photoreducible dyes in combination with amines or other coinitiators.

Suitable photopolymerizable acrylate or methacrylate monomers and oligomers are also known as described in EP 115,354. Very suitable are diethylene glycol diacrylate, trimethylolpropane triacrylate, pentaerythritol triacrylate or epoxy acrylates, bisphenol A, phenol or cresol novolaks, urethane acrylates or polyester acrylates. The epoxy acrylates can also be modified in a conventional manner with a carboxylic anhydride.

In addition to the stabilizer which is a hindered amine of component (E), any number of other additives may also be present such as dyes, plasticizers, adhesion promoters, emulsifiers, pigments, chain transfer agents, sensitizers, cure enhancers such as amines, solvents, flow control agents and the like.

In respect to radiation sources, any source capable of giving appropriate light irradiation is suitable such as Hg lamps, fluorescent lamps, lasers and the like.

Although photoinitiators are chiefly used, hybrid systems involving free radical and cationic initiators or photo/thermal initiators are also useable in the instant invention.

Although the scattering of light through photomasks is a common problem, light can be also be scattered by impurities of fillers which may be present in the formulation. This is especially the case in thick printing plates. Additionally, there are imaging techniques where no photomask is needed. For example, imaging can be done by scanning a laser across the photopolymerizable formulation or by focusing a laser on a solid photopolymerizable material to form a three-dimensional image. This is used in application such as stereo lithography and holography.

The following examples are meant to illustrate the instant invention and are not to be construed to limit the scope of the instant invention in any manner whatsoever.

EXAMPLE 1

Printing Plate Application

A liquid photopolymer mixture comprising 70 parts of an aliphatic diacrylate, 20 parts of epoxidized soya oil acrylate and 10 parts of 1,6-hexanediol diacrylate is used as the light sensitive material to make a printing plate. The light source is NAPP Model 9000 Napprinter unit equipped with 12 VHO black light lamps. The photomask is Sayce Logarithmic Test Chart (SLTC). The SLTC gives a series of bars after the photopolymer is imaged and later developed. The depth between two relief bars is measured and compared between various test formulation, with and without a radical polymerization inhibitor. The space between two bars is progressively narrower when the bar's identification number becomes larger. Consequently, the depth between two relief bars becomes shallower.

A Flexo Plate test chart is also utilized as a test target to evaluate image quality. The Flexo Plate test chart consists of several reverse bars that are progressively narrower when its identification line number becomes smaller.

Table I below shows that under the same exposure conditions, the reverse image quality can be improved by adding a small quantity of radical polymerization inhibitor to the test formulation. Without the radical inhibitor in the formulation, the reverse image depth for space #15 is 0.61 mm; by adding 0.001% by weight of Inhibitor A to the test formulation to prevent scattered light from initiating undesirable polymerization, the reverse image depth for the same space #15 is 0.71 mm. This represents a 17.4% improvement in image quality obtained by use of the radical inhibitor. This means that there is less fill-in between bars so that the image is neater, cleaner, deeper and with better resolution.

In the case where 0.001% by weight of Inhibitor B is used, the reverse image depth for space #15 is now 1.26 mm or an 107% improvement over the image depth when no inhibitor was present in the formulation.

TABLE I

Use of Different Inhibitors*

| Inhibitor** | Inhibit Conc % | Space | | | | | |
|---|---|---|---|---|---|---|---|
| | | #15 | #16 | #17 | #18 | #19 | #20 |
| None | 0 | 0.61 | 0.56 | 0.53 | 0.47 | 0.44 | 0.40 |
| A | 0.0001 | 0.88 | 0.78 | 0.73 | 0.65 | 0.62 | 0.53 |
| A | 0.001 | 0.71 | 0.67 | 0.59 | 0.59 | | |
| B | 0.0001 | 0.67 | 0.58 | 0.55 | 0.52 | 0.48 | 0.43 |
| B | 0.001 | 1.26 | 1.24 | 1.20 | 1.11 | 0.95 | 1.04 |
| C | 0.0001 | 0.64 | 0.57 | 0.53 | 0.49 | 0.45 | 0.43 |
| C | 0.001 | 0.79 | 0.73 | 0.68 | 0.65 | 0.58 | 0.54 |
| D | 0.0001 | 0.39 | 0.63 | 0.59 | 0.51 | 0.49 | 0.42 |
| D | 0.001 | 0.57 | 0.51 | 0.48 | 0.44 | 0.42 | 0.37 |
| D | 0.01 | 0.59 | 0.53 | 0.50 | 0.49 | 0.43 | 0.39 |
| E | 0.0001 | 0.37 | 0.35 | 0.32 | 0.30 | 0.30 | 0.30 |
| E | 0.001 | 0.39 | 0.36 | 0.38 | 0.28 | 0.34 | 0.34 |
| E | 0.01 | 0.49 | 0.41 | 0.45 | 0.40 | 0.38 | 0.35 |

TABLE I-continued

| | | | | | | | |
|---|---|---|---|---|---|---|---|
| F | 0.0001 | 0.50 | 0.47 | 0.44 | 0.39 | 0.38 | 0.34 |
| F | 0.001 | 0.50 | 0.46 | 0.44 | 0.40 | 0.39 | 0.34 |
| F | 0.01 | 0.49 | 0.40 | 0.41 | 0.39 | 0.35 | 0.32 |

*The Photoinitiator used is 1.5% by weight of 2,2-dimethoxy-2-phenyl-acetophenone, Irgacure ® 651 (Ciba-Geigy Corp). The exposure time is 60 seconds for floor and 30 seconds for image. The liquid printing plate model formulation requires two exposure to complete the plate making process. One exposure is designed for the formation of floor and another exposure is designed for the image formation step. There are several ways to evaluate the effect of inhibitors in the plate. One example is to give a constant exposure time regardless of the influence of inhibitors to the photopolymerization process. One may say that because of the constant exposure time, either the floor thickness or the relief of the image may not be the same for the examples given in Tables I and II. Therefore, the enhancement of image resolution may not be able to be attributed to the inhibitors in the formulation. To validate the results in Tables I and II, another experiment is conducted as seen in Table III. Two types of liquid printing plate are made. Their total plate thickness including the floor thickness and the relief thickness are 250 mils (6.35 mm) and 67 mils (1.70 mm). These two thicknesses are normally seen in commercial plate.
The purpose of this experiment is to make similar floor thickness and relief thickness and evlauate the effect of inhibitor on resolution of the image. To achieve this, different exposure times have to be employed. Results shown in Table III demonstrate that the inhibitor is useful in improving the resolution of the image. The depth between two bars in each
space is measured in millimeters (mm). The test target is the Sayce Logarithmic Test Chart (SLTC).
**A is bis(1-oxyl-2,2,6,6-tetramethylpiperidin-4-y1) sebacate.
B is a quinone methide, 4-benzylidene-2,6-di-tert-butyl-cyclohexa-2,5-dienone.
C is 1-oxyl-2,2,6,6-tetramethyl-4-hydroxypiperidine.
D is n-octadecyl 3,5-di-tert-butyl-4-hydroxyhydrocinnamate, Irganox ® 1076 (Ciba-Geigy Corp).
E is 2,6-dinitro-4-methylphenol.
F is 4-methoxyphenol.

Under different test conditions, it is possible to adjust exposure time so the test formulations with or without the inhibitor will give the same floor thickness as is seen in Table II. It is clear that even when different photoinitiator concentrations are used, the addition of a polymerization inhibitor to the formulation enhances the depth of the reverse images formed.

TABLE II

Use of Different Photoinitiators*

| 1.50% by wt Photo-Initiator** | Inhibit A Conc % | Space | | | | | |
|---|---|---|---|---|---|---|---|
| | | #15 | #16 | #17 | #18 | #19 | #20 |
| 1 | 0 | 0.61 | 0.56 | 0.53 | 0.47 | 0,44 | 0.40 |
| 1 | 0.0001 | 0.88 | 0.78 | 0.73 | 0.65 | 0.62 | 0.53 |
| 1 | 0.001 | 0.71 | 0.67 | 0.59 | 0.59 | | |
| 2 | 0 | 0.32 | 0.30 | 0.28 | 0.25 | 0.22 | |
| 2 | 0.0001 | 0.36 | 0.36 | 0.34 | 0.31 | 0.26 | 0.26 |
| 3 | 0 | 0.32 | 0.32 | — | 0.24 | 0.26 | 0.24 |
| 3 | 0.0001 | 0.33 | 0.36 | 0.29 | 0.28 | 0.24 | 0.25 |

*The inhibitor A is bis(1-oxyl-2,2,6,6-tetramethylpiperidin-4-yl) sebacate. The depth between the two bars is measured in millimeters (mm) and the test target is the Sayce Logarithmic Test Chart. The floor thickness in mils for the runs with photoinitiator 2 is 75 mils (1.91 mm) and for initiator 3 is 79 mils (2 mm).
**Photoinitiator 1 is 2,2-dimethoxy-2-phenylacetophenone, Irgacure ® 651 (Ciba-Geigy Corp.).
Photoinitiator 2 is bis(2,6-dimethoxybenzoyl)-2,4,4-trimethylpentyl) phosphine oxide.
Photoinitiator 3 is 2-benzyl-2-(N,N-dimethylamino)-1-(4-morpholinophenyl)-1-butanone, Irgacure ® 369 (Ciba-Geigy Corp.).

TABLE III

Effect of Inhibitor in Liquid Printing Plate*

| % Photo-Initiator** | Inhibit A Conc % | Floor Thick Mils | Line | | | | |
|---|---|---|---|---|---|---|---|
| | | | #30 | #15 | #10 | #7 | #5 |
| 250 mils Thick Plate | | | | | | | |
| 0.8 | 0 | 118 | 11.5 | 3.35 | 1.8 | 1.4 | |
| 0.8 | 0.005 | 108 | 16.5 | 5.65 | 2.8 | 2.0 | 1.25 |
| 0.5 | 0 | 129 | 3.95 | 2.65 | 2.1 | 1.45 | |
| 0.5 | 0.005 | 120 | 17.7 | 5.85 | 2.45 | 2.3 | 1.8 |
| 67 Mils Thick Plate | | | | | | | |
| 0.8 | 0 | 45 | 5.4 | | 2.25 | 2.1 | 1.5 |
| 0.8 | 0.005 | 33 | 13.5 | | 3.75 | 1.55 | |
| 0.8 | 0.01 | 48 | 8.9 | | 3.9 | 2.8 | 1.9 |

**The inhibitor A is bis(1-oxyl-2,2,6,6-tetramethylpiperidin-4-y1) sebacate. The depth between the two bars is measured in millimeters (mm) and the test target is the Sayce Logarithmic Test Chart.
**The photoinitiator is 2,2-dimethoxy-2-phenylacetophenone, Irgacure ® 651 (Ciba-Geigy Corp).

In summary, the data given in Example 1 show that under the same exposure condition one can have different floor thickness or can adjust exposure time to obtain the same floor thickness. In either case, the reverse image quality can be improved by the addition of a small effective amount of polymerization inhibitor into the photocurable formulation and this improvement is independent of floor thickness.

EXAMPLE 2

Electronic Application

A two-pack solder mask formulation is prepared according to the following procedure. A first composition is prepared by mixing 25.4 parts by weight of a partial ester of hydroxyethyl methacrylate and a styrene-maleic anhydride copolymer [SMA 1000 (Arco Chemical); ratio 45:55]; 6.44 parts of ethylene glycol monobutyl ether acetate; 4.97 parts of an acid modified acrylate ester of bisphenol-A based epoxy resin (Novacure® 3800, Interez Inc.)); 1.84 parts of ethoxylated trimethylolpropane triacrylate; 2.0 parts of trimethylolpropane triacrylate; 0.93 parts of Modaflow flow promoting agent; 0.92 parts of a release agent; 7.37 parts of 2-methyl-1-[4-(methylthio)phenyl]-2-morpholino-propanone-1 (Irgacure® 907, Ciba-Geigy Corp.) and 1.33 parts of thioxanthone photoinitiator at room temperature.

A second composition is prepared by mixing 14.89 parts of an epoxy cresol novalac resin (Epon® DPS 164, Shell); 7.35 parts of phenolic novolac (Araldite® EPN 1138, Ciba-Geigy); and 9.10 parts of ethylene glycol monobutyl ether acetate. The mixture is then melted to reduce viscosity for easy processing. Finally 3.66 parts of fume silica (Carbosil® M-5, Cabot) is added.

The two composition are mixed at room temperature with stirring and are then ground using a three-roll mill. A 1-2 mil thick coating of the resultant mixture is deposited onto a copper plate using a #3 rod. After the coating is dried at 80° C. for about 25 minutes and then cooled to room temperature, a tack-free coating is obtain. The coated board is then placed on a vacuum plate with a negative photo mask placed on top. The board is then covered with a thin, clear polyethylene film and subjected to about 400 millijoules of UV radiation. The image is developed by washing with a 1% aqueous sodium carbonate solution for one minute at 50° C. The resulting image of cured polymer on the board is given a post cure of 2.4 joules using a medium pressure Hg lamp and finally baked in an oven at 150° C. for one hour.

A "Microcopy Resolution Test Chart" is used as a photo mask to evaluate the image resolution. The test chart consists of 18 patterns with different number assigned to each pattern. Each number represents the resolution of the pattern next to it. The higher the number that is obtained, the better is the image resolution that is achieved. The results are seen in Table III below.

TABLE IV

Effect of Inhibitor on Solder Mask Resolution

| Inhibitor A* Conc (%) | Resolution Step |
|---|---|
| 0 | 2.5 |
| 0.005 | 2.5 |
| 0.01 | 2.5 |
| 0.05 | 4 |
| 0.1 | 9 |
| 0.15 | 9 |
| 0.2 | 10 |
| 0.3 | 10 |
| 0.5 | 10 |

*Inhibitor A is bis(1-oxyl-2,2,6,6-tetramethylpiperidin-4-yl) sebacate.

From the results given on Table IV, it is clear that adding a small quantity of free radical inhibitor to the solder mask formulation significantly improves the image resolution. The best image resolution that can be obtained for the formulation without an inhibitor is 2.5, but by adding 0.05% or 0.1% of inhibitor A to the formulation, the image resolution becomes 4 and 9 respectively.

What is claimed is:

1. A process to reduce the undesired polymerization caused by scattered and diffused light in a photopolymerizable material and to improve the quality and resolution of the final developed image formed by the irradiation of said photopolymerizable material by light, wherein the process comprises adding to the photopolymerizable material an effective inhibiting amount of an inhibitor which is bis(1-oxyl-2,2,6,6-tetra-methylpiperidin-4-yl) sebacate, wherein the amount of said inhibitor is sufficient to prevent or mitigate polymerization by diffused or scattered light, but is insufficient to prevent polymerization of the photopolyrnerizable material irradiated directly by light.

2. A process according to claim 1 wherein the polymerization inhibitor is present in an effective inhibiting amount of 0.0001 to 0.2% by weight of the total composition.

3. A process according to claim 1 wherein the light is actinic light.

4. A process according to claim 1 wherein irradiation of the light occurs through a photomask.

5. A photosensitive resin composition for preparing a relief printing plate, an etch resist, a solder mask or a screen printing stencil which comprises (A) from 5 to 98% by weight, based on the total weight of the components (A), (B), (C) and (D), of a polymer selected from the group consisting of an oligomer, a binder polymer and a mixture thereof, (B) from 1.0 to 94% by weight, based on the total weight of components (A), (B), (C) and (D), of an ethylenically unsaturated monomer, (C) from 0.001 to 10% by weight, based on the total weight of components (A), (B), (C) and (D), of a photopolymerization initiator selected from the group consisting of an acetophenone, a benzoin, a benzophenone, an anthraquinone, a xanthone, a thioxanthrone, and a mixture of one or more of these initiators, and (D) from 0.0001 to 0.2% by weight, based on the total weight of components (A), (B), (C) and (D), of a polymerization inhibitor which is bis(1-oxyl-2,2,6,6-tetramethylpiperidin-4-yl) sebacate.

6. A composition according to claim 5 which additionally contains component (E) which is from 0.05 to 10% by weight, based on the total weight of the composition, of a hindered amine containing a 2,2,6,6-tetramethylpiperldine moiety.

* * * * *